(12) United States Patent
She et al.

(10) Patent No.: US 10,041,171 B2
(45) Date of Patent: Aug. 7, 2018

(54) PARTICULATES FOR ADDITIVE MANUFACTURING TECHNIQUES

(71) Applicant: Delavan Inc, West Des Moines, IA (US)

(72) Inventors: Ying She, East Hartford, CT (US); Michael A. Klecka, Vernon, CT (US); Tahany I. El-Wardany, Bloomfield, CT (US); Anais Espinal, West Harford, CT (US); Wayde R. Schmidt, Pomfret Center, CT (US); Sameh Dardona, South Windsor, CT (US)

(73) Assignee: Delavan Inc., West Des Moines, IA (US)

( * ) Notice: Subject to any disclaimer, the term of this patent is extended or adjusted under 35 U.S.C. 154(b) by 252 days.

(21) Appl. No.: 14/822,713

(22) Filed: Aug. 10, 2015

(65) Prior Publication Data
US 2017/0044354 A1 Feb. 16, 2017

(51) Int. Cl.
| | |
|---|---|
| B22F 1/00 | (2006.01) |
| C23C 16/442 | (2006.01) |
| H01B 1/22 | (2006.01) |
| C09D 183/04 | (2006.01) |
| C23C 14/12 | (2006.01) |
| B01J 3/00 | (2006.01) |
| B22F 3/00 | (2006.01) |
| B33Y 70/00 | (2015.01) |

(52) U.S. Cl.
CPC .............. *C23C 16/442* (2013.01); *B01J 3/00* (2013.01); *C09D 183/04* (2013.01); *C23C 14/12* (2013.01); *H01B 1/22* (2013.01); *B22F 3/008* (2013.01); *B22F 2998/10* (2013.01); *B22F 2999/00* (2013.01); *B33Y 70/00* (2014.12)

(58) Field of Classification Search
CPC ................................ B01J 2/006; B22F 1/0062
USPC .............................................. 264/101; 419/35
See application file for complete search history.

(56) References Cited

U.S. PATENT DOCUMENTS

| | | | |
|---|---|---|---|
| 5,068,150 | A | 11/1991 | Nakamura et al. |
| 5,649,277 | A | 7/1997 | Greul et al. |

(Continued)

FOREIGN PATENT DOCUMENTS

| | | |
|---|---|---|
| EP | 2918359 A1 | 9/2015 |
| GB | 2422344 A | 7/2006 |

(Continued)

OTHER PUBLICATIONS

Communication Received from intellectual Property Office enclosing Search Report dated Apr. 12, 2017 for Application No. GB1618764.3.

*Primary Examiner* — Khanh Tuan Nguyen
(74) *Attorney, Agent, or Firm* — Locke Lord LLP; Scott D. Wofsy; Christopher J. Cillié

(57) ABSTRACT

A particulate for an additive manufacturing technique includes metallic particulate bodies with exterior surfaces bearing a polymeric coating. The polymeric coating is conformally disposed over the exterior surface that prevents the underlying metallic body from oxidation upon exposure to the ambient environment by isolating the metallic particulate bodies from the ambient environment. Feedstock materials for additive manufacturing techniques, and methods of making such feedstock, are also disclosed.

11 Claims, 5 Drawing Sheets

(56) References Cited

U.S. PATENT DOCUMENTS

| | | | |
|---|---|---|---|
| 6,224,798 B1 * | 5/2001 | Gay | B01J 2/006 264/101 |
| 2007/0238056 A1 | 10/2007 | Baumann et al. | |
| 2014/0151013 A1 | 6/2014 | Wallmeroth et al. | |
| 2015/0034604 A1 | 2/2015 | Subramanian et al. | |
| 2015/0125334 A1 | 5/2015 | Uetani et al. | |
| 2015/0321253 A1 * | 11/2015 | Espinal | B22F 1/0062 419/35 |

FOREIGN PATENT DOCUMENTS

| | | |
|---|---|---|
| GB | 2493398 A | 2/2013 |
| KR | 20160091329 A | 8/2016 |

* cited by examiner

PARTICULATES FOR ADDITIVE MANUFACTURING TECHNIQUES

GOVERNMENT LICENSE RIGHTS STATEMENT

This invention was made with government support under Contract No. DE-AR-0000308 awarded by the Department of Energy. The government has certain rights in the invention.

BACKGROUND OF THE INVENTION

1. Field of the Invention

The present disclosure relates to particulates and methods of making particulate materials, and more particularly to particulate feedstock for additive manufacturing techniques.

2. Description of Related Art

Additive manufacturing techniques are commonly used to fabricate articles by depositing successive layers on a substrate. Additive manufacturing systems typically scan a high-density energy source like a laser or electron beam over a powder according to a predetermined two-dimensional slice of an article geometry. Application of the high-density energy to the particulate fuses the particulate into a layer, which is integral with the underlying substrate. Once a given scan is completed, additional particulate is generally deposited over the fused layer, and succeeding layers thereafter fused overtop the preceding layers. Subsequent layers are added over one another until the article is fully developed, at which time the article is removed from the substrate. In some additive manufacturing techniques physical properties of the article can be influenced by the composition of the particulate used in the additive manufacturing technique as well as interaction of particulate constituents with the fusing process.

Such conventional methods and systems have generally been considered satisfactory for their intended purpose. However, there is still a need in the art for improved particulates and methods of making particulate for additive manufacturing techniques. The present disclosure provides a solution for this need.

SUMMARY OF THE INVENTION

A particulate for an additive manufacturing technique includes metallic particulate bodies (i.e. particles) with exterior surfaces coated with a polymeric material. The polymeric material is conformally disposed as a relatively thin coating over the exterior surface that prevents the underlying metallic body from oxidation upon exposure to the ambient environment by isolating the metallic particulate bodies from the ambient environment.

In certain embodiments, the metallic material of the particulate body can include copper, aluminum, nickel, alloys thereof, or any other suitable metallic material. The metallic material can include elemental copper. In an illustrative exemplary embodiment the metallic material includes elemental copper free from copper oxide. In this respect exterior surfaces of the metallic body are free from copper oxides, like cupric oxide and cuprous oxide, such that additively manufactured articles formed from the particulate have low porosity.

In accordance with certain embodiments, the polymeric material can be disposed over the entire exterior surface of the particulate bodies. The polymeric material can include polydimethylsiloxane. The polymeric material can disposed over an elemental surface that is substantially free of oxygen. The polymeric material can be disposed in a layer with a thickness that is about one nanometer. In the illustrative exemplary embodiment the polymeric material is disposed over an exterior surface that is elemental copper and is oxide-free.

It is also contemplated that a feedstock for an additive manufacturing technique can include particles as described above. The feedstock can have reflectivity (or brightness) that is greater than that of elemental copper and/or elemental copper bearing a copper oxide layer. The feedstock can be more flowable than elemental copper and/or elemental copper bearing an oxide layer. In this respect, an angle of repose of a given amount of particulate may be smaller (i.e. form a less steep pile) than the angle of repose of equivalent amounts of elemental copper particulate and/or the angle of repose for elemental copper particulate bearing oxide layers.

A method of making a particulate for an additive manufacturing technique includes receiving metallic particulate at a fluidized bed apparatus. The metallic particulate is reduced by flowing a reducing gas through the metallic particulate while the metallic particulate is maintained at a reducing temperature, thereby converting metallic oxides of the metallic particulate to elemental material. A drying and degassing gas is then flowed through the metallic particulate while the metallic material is maintained at a drying and degassing temperature, thereby removing water vapor generated by reduction of the metallic oxides. A coating gas including an inert gas and a vaporized polymeric material is then flowed through the metallic particulate while the metallic particulate is maintained at a coating temperature, thereby causing the polymeric material to deposit on the metallic particulate as discrete particle polymeric coatings. It is contemplated that the inert gas bearing the polymeric material flows to the metallic material from a polymeric material reservoir maintained at polymeric material vaporization temperature, a temperature differential between the inert gas bearing the vaporized polymeric material and the metallic particulate facilitating development of the discrete particle coatings.

In certain embodiments the drying and degassing temperature of the metallic particulate can be less than the reducing temperature of the metallic particulate. The coating temperature of the metallic temperature can be less than the drying and degassing temperature of the metallic particulate. The polymeric material vaporization temperature can be less than the reducing temperature of the metallic particulate. The polymeric material vaporization temperature can also be greater than the drying and degassing temperature of the metallic particulate. In an exemplary embodiment of the method the metallic particulate reducing temperature can be about 500 degrees Celsius, the metallic particulate degassing and drying temperature is between about 150 and 200 degrees Celsius, the metallic particulate coating temperature is about 50 degrees Celsius, and the polymeric material vaporization temperature can be about 240 degrees Celsius.

In certain embodiments receiving the metallic particulate can include receiving a copper particulate material having a copper oxide layer. The reducing gas can include hydrogen gas, and the reducing gas can be flowed through the metallic material for a reducing time interval of about twelve (12) hours. The drying and degassing gas can include an inert gas like nitrogen, helium, argon, or any other suitable inert gas, and can be flowed through the metallic material for a drying and degassing interval of about two (2) hours. The coating gas can include an inert gas and a polymeric material, and can be flowed through the metallic material for a coating interval of about two (2) hours.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE PREFERRED EMBODIMENTS

Figure 1:
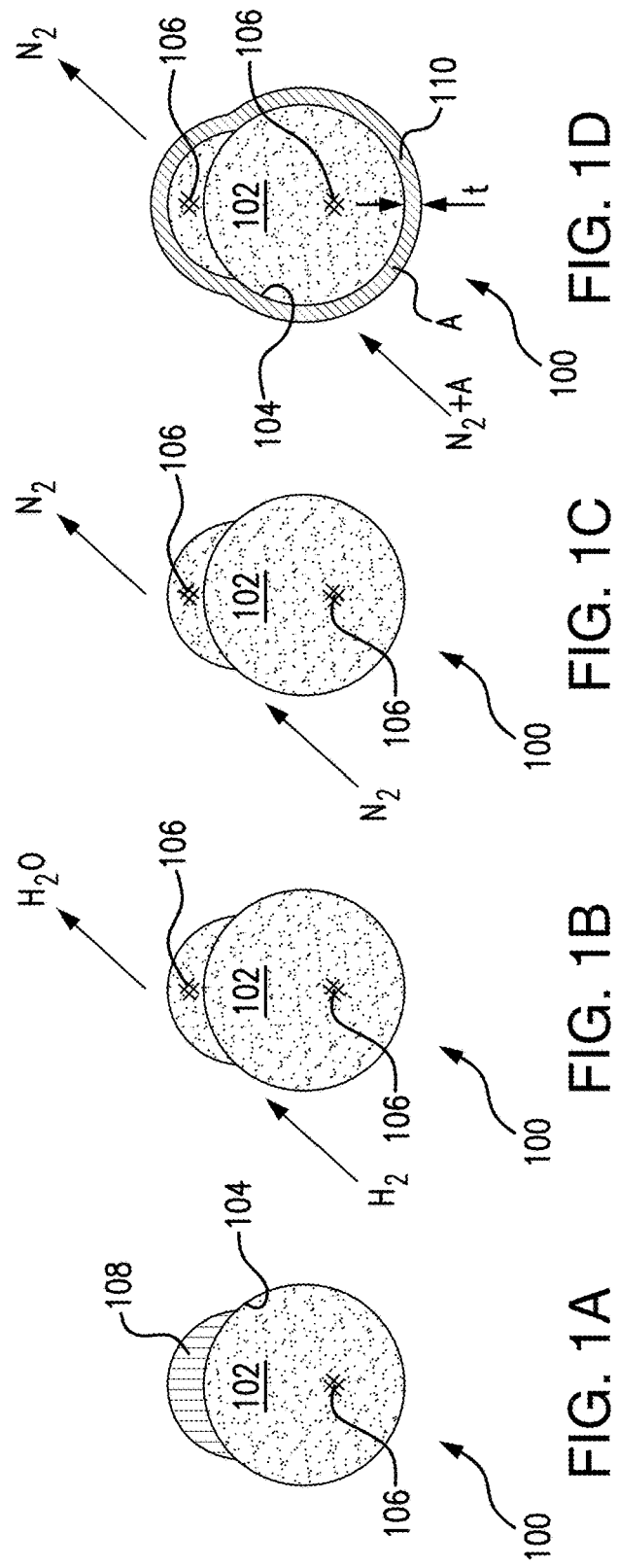
FIGS. 1A-1D are schematic views of an exemplary embodiment of particulate for an additive manufacturing process constructed in accordance with the present disclosure, showing a metallic body with oxide having the oxide reduced, cooled, and coated with a polymeric material.

Reference will now be made to the drawings wherein like reference numerals identify similar structural features or aspects of the subject disclosure. For purposes of explanation and illustration, and not limitation, a partial view of an exemplary embodiment of particulate in accordance with the disclosure is shown in FIG. 1 and is designated generally by reference character 100. Other embodiments of particulate, feedstock, apparatus for making particulate and feedstock, and methods of making particulate and feedstock in accordance with the disclosure, or aspects thereof, are provided in FIGS. 2-5B, as will be described. The systems and methods described herein can be used for making additively manufactured articles with low porosity using metallic particulate prone to oxidation.

Referring to FIGS. 1A-1D, a particulate 100 for an additive manufacturing technique is shown undergoing reduction and coating development operations. With reference to FIG. 1A, particulate 100 includes a particulate body 102. Particulate body 102 has a surface 104 and includes an elemental metallic material 106. Particulate body 102 also includes an oxide 108 of metallic material 106. It is contemplated that metallic material 106 includes a material like copper, aluminum, nickel, iron or any other suitable material that is prone to oxidation upon exposure to the ambient environment. In the illustrated exemplary embodiment, metallic material 106 is elemental copper that is substantially pure and contiguous throughout particulate body 102. Oxide 108 includes an oxide of copper, like cupric oxide and/or cuprous oxide, disposed over surface 104 of particulate body 102.

With reference to FIG. 1B, particulate 100 is shown in a flow of reducing gas. In illustrated exemplary embodiment, the reducing gas includes a flow of substantially pure hydrogen ($H_2$) that flows through particulate 100 by traversing both particulate body 102 and oxide 108. With respect to oxide 108, the reducing gas extracts and carries away oxygen from the oxide, leaving elemental copper. Subsequent to reduction, particulate 100 is comprised solely of elemental copper. While undergoing reduction, particulate 100 is maintained at a reducing temperature for a reducing time interval. In an exemplary embodiment, copper particulate is maintained at about 500 degrees Celsius for a reducing time interval being about twelve (12) hours, reducing copper oxide layers that may have developed on the copper particles. As will be appreciated, other reducing temperatures and reducing time intervals may be utilized as suitable for the metallic material forming the metallic particulate 100.

With reference to FIG. 1C, particulate 100 is shown in a drying and degassing gas flow that includes nitrogen ($N_2$). The drying and degassing gas flow includes an inert gas like nitrogen (illustrated), helium, argon, or any other suitable inert gas, and carries away water vapor that may be generated during the reduction process. This prevents water vapor that may have been generated from interaction of the hydrogen gas with oxides of the metallic material forming particulate 100 from forming new oxides within particulate 100. While undergoing drying and degassing, particulate 100 is maintained at drying and degassing temperature that is less than the metallic particulate reduction temperature. In an exemplary embodiment, copper particulate is maintained at drying and degassing temperature between about 100 degrees Celsius and about 150 degrees Celsius while an inert gas is flowed through the reduced copper particles for a drying and degassing time interval of about two (2) hours. As will be appreciated, other drying and degassing temperatures and time intervals may be utilized as suitable for metallic material forming metallic particulate 100.

With reference to FIG. 1D, particulate 100 is shown in a flow of coating gas. The coating gas includes an inert gas and a polymeric material, the inert gas being nitrogen ($N_2$) and the polymeric material A being polydimethylsiloxane in the illustrated exemplary embodiment. As the coating gas traverses both particulate body 102 a polymeric coating 110 develops over surface 104 of particulate 100. Polymeric coating 110 develops as a relatively thin coating extending about substantially the entirety of surface 104 of particles of particulate 100, and in a contemplated embodiment develops with a thickness t that is about one (1) nanometer. In the exemplary embodiment, copper particulate is maintained at a temperature of about fifty (50) degrees Celsius while a coating gas including polydimethylsiloxane (PDMS) is flowed through particles forming particulate 100 during a coating time interval of about two (2) hours. As will be appreciated, other coating temperatures and/or coating time intervals may be utilized as suitable for the polymeric material and the metallic material forming the metallic particulate.

The coating gas flows between a vessel 340 (shown in FIG. 3) containing polymeric material A. Polymeric material A is maintained at a polymeric material vaporization temperature. This allows vaporized polymeric material A to be taken up by an inert gas provided to vessel 340 and borne thereby to a fluidized bed apparatus 310 (shown in FIG. 3) containing particulate 100 at the coating temperature. The coating temperature is less than the polymeric material vaporization material, causing polymeric material A to cool and coat surfaces of the discrete particles to form polymeric coating 110 over substantially the entire surface of discrete particles forming particulate 100. It is contemplated that differential between the polymeric material vaporization temperature of polymeric material A and the coating temperature of particulate 100 can be as high as 190 degrees Celsius, though higher temperature differentials are within the scope of the present disclosure.

Coating particulate 100 with relatively thin polymeric coatings such as illustrated can prevent oxidation of metallic material 106 included therein by hermetically isolating metallic material 106 from water vapor and/or other contaminates to which particulate 100 may be exposed during storage, handing, and/or use in additive manufacturing techniques that could influence the porosity of articles formed using the particulate. Such thin polymeric coatings can be vaporized during fusing and prior to particulate 100 solidifying, thereby preventing polymeric material A from becoming incorporated into the article and/or potentially influencing the mechanical or electrical properties of the article formed by the additive manufacturing technique.

In embodiments, polymeric material A includes PDMS. PDMS, in a relatively thin coating (e.g. about one (1) nanometer), renders coated particulate 100 inert when exposed to the ambient environment. Coating particulate 100 with a material like PDMS can also improve the handling properties of the material, such as its flowability, the coating tending to reduce the tendency of the particles to develop static charges from contact with other particles that otherwise would cause the particles to weakly bond with one another. Flowability may include the ability of the powder to flow at a given rate or the amount of resistance encountered by particles as they move in a shared general direction at different rates.

Figure 2:
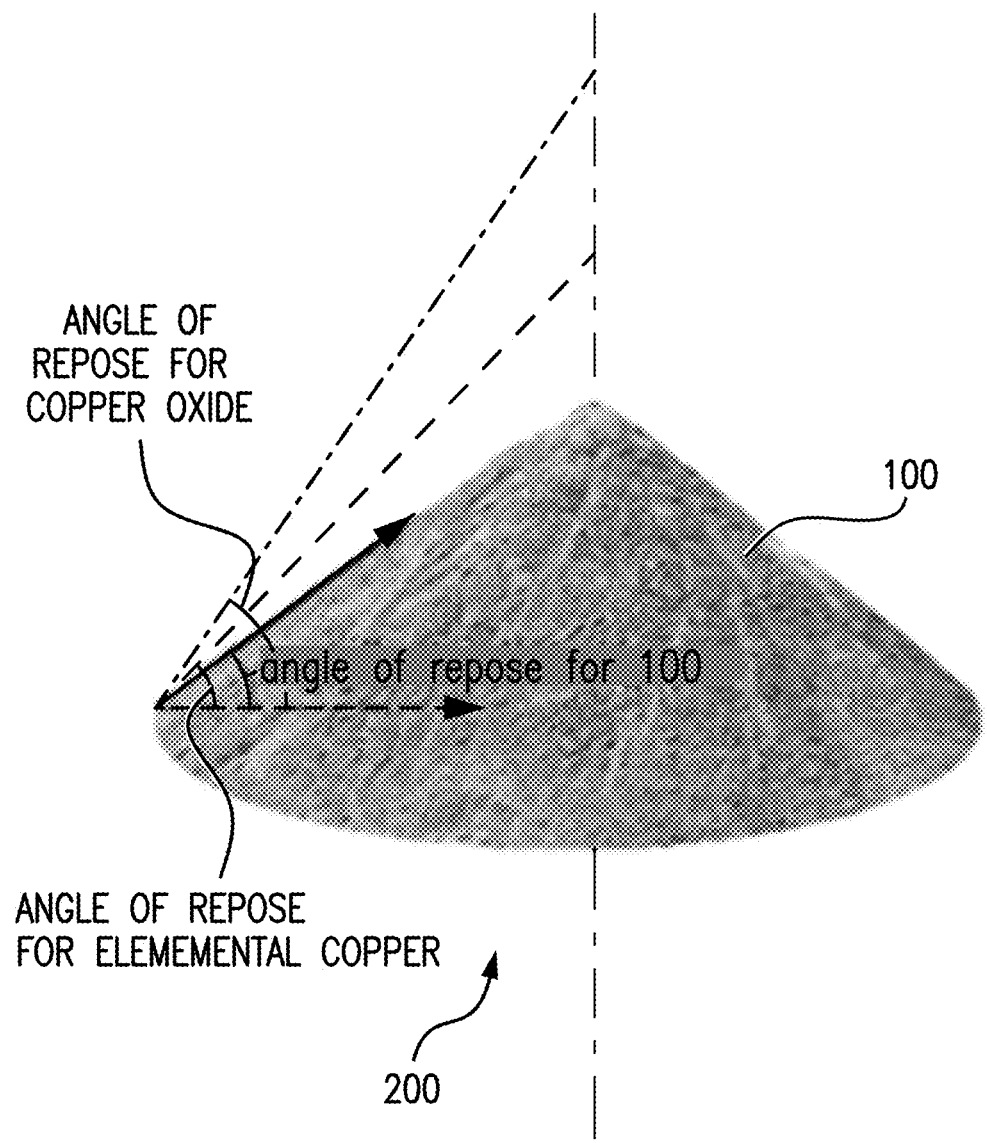
FIG. 2 is a side elevation view of feedstock for an additive manufacturing process including the particulate of FIG. 1, showing an angle of repose of the feedstock relative to those of elemental copper particulate and copper particulate bearing copper oxide.

With reference to FIG. 2, a feedstock 200 for an additive manufacturing process is shown. Feedstock 200 includes a particulate 100 having a polymeric coating 110 that includes PDMS. Particles coated with PDMS are more flowable than both uncoated particles formed solely from the underlying elemental material and oxides of the underlying material. As a consequence, feedstock 200 has a smaller angle of repose than the underlying particulate material in elemental form as well as oxides of the underlying particulate material. For example, as shown in FIG. 2, the angle of repose of PDMS coated copper particulate is smaller than the angle of repose of both copper particulate and oxidized copper particulate. This can simplify handling feedstock 200, simplifying manufacture of components additively manufactured therefrom. It can also allow for fabrication, using additive manufacturing techniques, structures with relatively fine feature sizes—such as features found in motors including copper-containing components.

Figure 3:
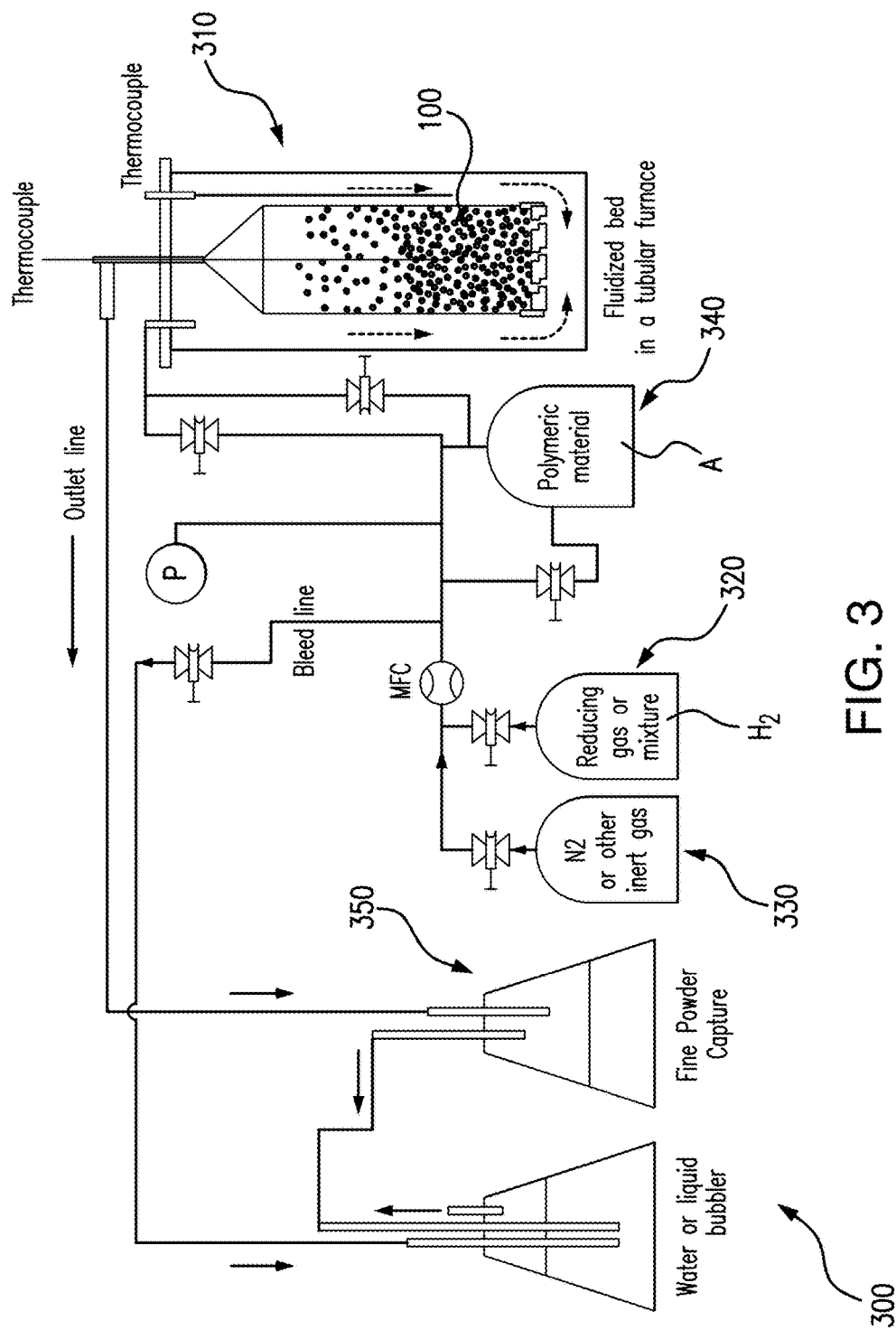
FIG. 3 is a schematic view of an apparatus for making the particulate of FIG. 1, showing a fluidized bed apparatus.

With reference to FIG. 3, a fluidized bed apparatus 300 is shown for reducing and coating particulate 100 and generating feedstock 200 (shown in FIG. 2). Aspects of fluidized bed apparatus 300 are described in U.S. patent application Ser. No. 61/815,359, U.S. patent application Ser. No. 61/931,295, and U.S. patent application Ser. No. 61/980,681, each of which is incorporated herein by reference in their entirety, and which is assigned to the Applicant of the instant application. Particulate 100, which may have an oxides layer, is received within in a fluidized bed apparatus 310. Particulate 100 is therein maintained at the reducing temperature and a reducing gas is flowed through particulate 100 for the reducing time interval. The reducing gas flow reduces the oxide layer, e.g. oxide layer 108 (shown in FIG. 1A), to elemental form. The reducing gas can be pure hydrogen, a hydrogen gas mixture, carbon monoxide or any other suitable gas, and is provided to fluidized bed apparatus 310 from a reducing gas source 320.

Once particulate 100 is reduced, the drying and degassing gas flow is provided from a gas source 330 to fluidized bed apparatus 310. While the drying and degassing gas flow is provided to fluidized bed apparatus 310, particulate 100 is maintained at the drying and degassing temperature. The drying and degassing temperature is less than the reducing temperature and is provided for drying and degassing time interval that is sufficient to carry away substantially all water vapor disposed within particulate 100 and which may develop as a result of the reducing process.

Subsequent to drying and degassing particulate 100, the coating gas is provided to fluidized bed apparatus 310 by flowing an inert gas through a vessel 340 containing polymeric material A. Polymeric material A is maintained at the polymeric material vaporization temperature within vessel 340, and the inert gas supplied to vessel 340 can be the same gas as used for drying and degassing particulate 100. This simplifies the process of coating particulate 100 by allowing a single inert gas source, e.g. gas source 330, to provide inert gas for both drying and degassing particulate 100 as well as an inert gas bearing polymeric material A to fluidized bed apparatus 310.

Figure 4:
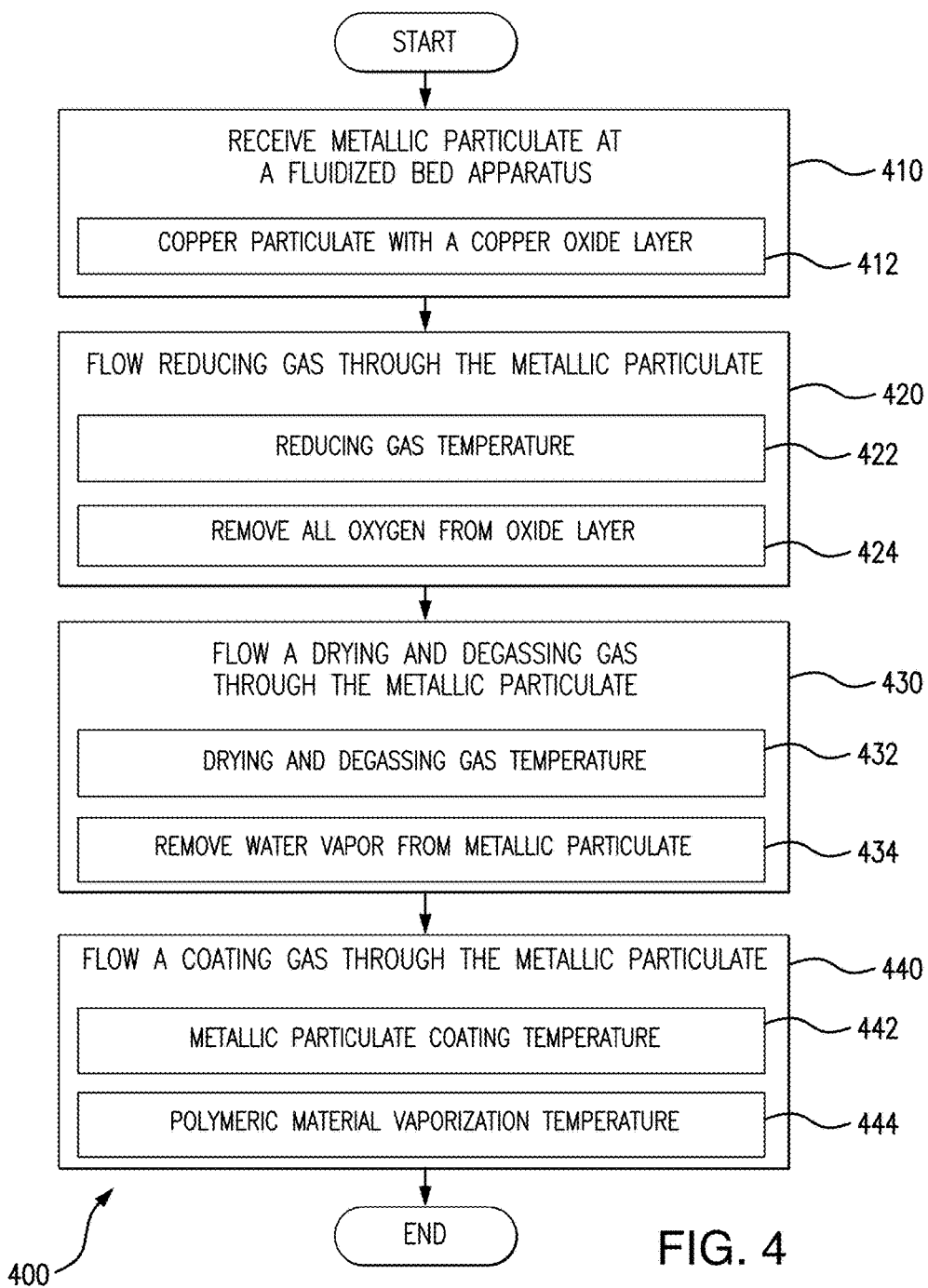
FIG. 4 is a schematic view of a method for making particulate and feedstock for an additive manufacturing process.

With reference to FIG. 4, a method of making particulate is indicated generally by reference numeral 400. As shown with box 410, method 400 includes receiving particulate, e.g. particulate 100 (shown in FIG. 1A) in a fluidized bed apparatus, e.g. fluidized bed apparatus 310 (shown in FIG. 3). The particulate can include both an elemental material and oxides of the elemental material. As shown with box 420, a reducing gas is thereafter flowed through the particulate while the particulate is maintained at a reducing temperature. A drying and degassing gas flow is then flowed through the particulate, as shown with box 430. Once the particulate has been dried and degassed by the drying and degassing gas flow, a coating gas is flowed through the particulate as shown with box 440. The coating gas includes a polymeric material and an inert gas, and the particulate is maintained at a coating temperature that is less than the polymeric material vaporization temperature such that a polymeric coating forms over substantially the entire surface of respective particles within particulate disposed within the fluidized bed apparatus.

Figure 5A:
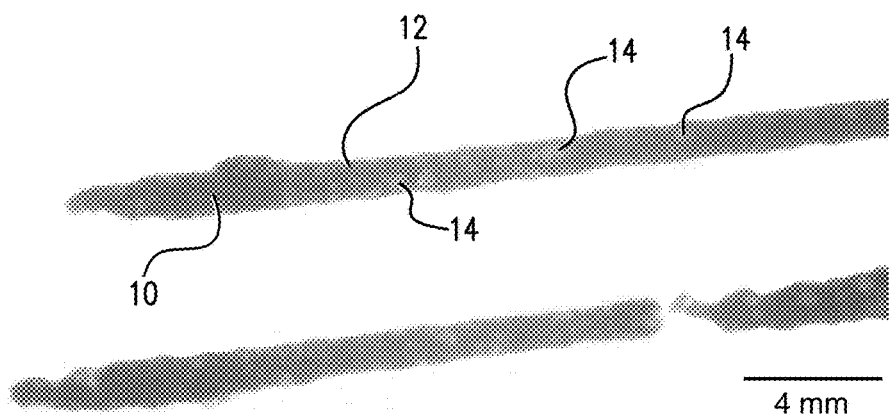
FIGS. 5A and 5B are perspective views of conductors constructed using an additive manufacturing technique, FIG. 5A showing a conductor fabricated without decomposing copper oxide deposits within (or on) the copper particulate and FIG. 5B showing a conductor fabricated using copper powder prepared using an embodiment of the methods described herein.
Figure 5B:
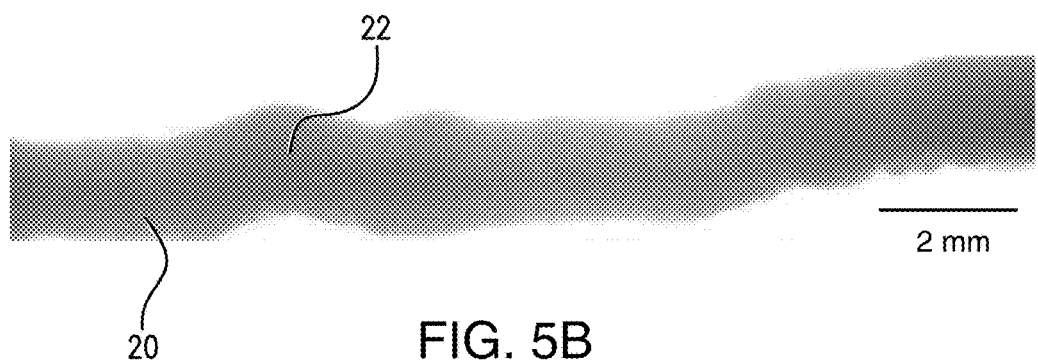

With reference to FIGS. 5A and 5B, a conductor 10 and a conductor 20 each fabricated using an additive manufacturing technique are shown. Referring to FIG. 5A, conductor 10 has a copper body 12 that is interrupted by one or more voids 14. Voids 14, indicated with relatively lightly shaded surface portions in FIG. 5A, are associated with the liberation of oxygen from copper oxide when exposed to a high density energy source during fusing, and generally increase the electrical resistance and reduce the thermal conductivity of conductor 10 relative to solid conductor having the same geometry and having contiguous elemental copper.

Referring to FIG. 5B, conductor 20 is shown. Conductor 20 has substantially the same geometry as conductor 10 (shown in FIG. 5A) and includes a body 22 that is formed from contiguous elemental copper. Conductor 20 is formed from particulate as described herein, and includes substantially no voids not withstanding having been fused by exposure to the same high density energy source as conductor 10 (shown in FIG. 5A). Absence of copper oxide deposits within (and/or on) particulate used to form conductor 20 provides an electrical resistance that is lower and a thermal conductivity that is higher than that of conductor 10 (shown in FIG. 5A).

Additive manufacturing techniques can allow for deposition of copper with a predetermined feature size. However, some copper particulates can form a relatively thin layer of copper oxide, i.e., cuprous oxide and cupric oxide, on exterior portions of the copper particles. The copper oxide can be an artifact of the copper manufacturing process or can be the result of exposure of the copper particulate to the ambient environment. Such copper oxides can decompose into copper and oxygen at temperatures encountered during powder fusing in some additive manufacturing techniques, potentially causing voids to develop in the fused layer due to the tendency of oxygen to expand rapidly. Porosity in turn can change the properties of the article developed using the additive manufacturing technique, such as reducing the conductivity of a conductor developed using the technique.

In embodiments described herein, particulates for additive manufacturing techniques prone to oxidation are ruggedized such that they are less likely to form oxide layers on their exterior surfaces. This renders the particulate less apt to oxidize upon exposure to the ambient environment, simplifying handling of the particulate. For example, in certain embodiments copper particulate including copper oxide is reduced to elemental copper particulate the elemental copper particulate is encapsulated in a conformal barrier material. The barrier material may include a polymeric material that provides both isolation from the ambient environment as well as improves the flowability of the copper particulate.

In certain embodiments, reduction of the oxidized particulate can occur in a fluidized bed system. The reduction can occur in the presence of a reducing gas, such high-purity hydrogen, a hydrogen gas mixture, carbon monoxide or any other suitable reduction gas. The reduction can also entail the use of an inert gas, which is preheated in the shell side between an outer tubing and inner tubing of the fluidized bed system prior to entering the charge chamber from below to a preheat temperature that is in the range of 150 to 200 degrees Celsius. Examples of suitable inert gases include nitrogen, helium, and argon.

The methods and systems of the present disclosure, as described above and shown in the drawings, provide for particulates with superior properties including improved purity. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A method of making particulate for an additive manufacturing technique, the method comprising:
   receiving a metallic particulate at a fluidized bed apparatus;
   flowing a reducing gas through the metallic particulate;
   flowing a drying and degassing gas through the metallic particulate; and
   flowing a coating gas from vessel containing a polymeric material maintained at a polymeric material vaporization temperature through the metallic particulate, wherein the metallic particulate is maintained at a coating temperature that is less than the polymeric material vaporization temperature to encapsulate the metallic particulate with polymeric material coatings.

2. A method as recited in claim 1, wherein the metallic particulate is maintained at a drying and degassing temperature while the drying and degassing gas is flowed therethrough at a temperature that is lower than a reducing temperature at which the metallic particulate is held while the reducing gas is flowed therethrough.

3. A method as recited in claim 1, wherein the metallic particulate is maintained at coating temperature while the coating gas is flowed therethrough that is less than a drying and degassing temperature at which the metallic particulate is held while the drying the degassing temperature is flowed therethrough.

4. A method as recited in claim 1, wherein the coating gas is flowed from a vessel containing polymeric material that is maintained at a polymeric material vaporization temperature that is greater than a coating temperature at which the metallic particulate is maintained while the coating gas is flowed therethrough.

5. A method as recited in claim 1, wherein flowing a reducing gas through the metallic particulate includes removing oxygen from oxidized portions of the metallic particulate prior to flowing the coating gas through the particulate material.

6. A method as recited in claim 1, wherein flowing a degassing and drying gas flow through the metallic particulate includes removing water vapor generated during the reducing process from the metallic particulate.

7. A method as recited in claim 1, wherein flowing a drying and degassing gas through the metallic particulate and flowing the coating gas through the metallic particulate include flowing an inert gas from an inert gas source.

8. A method as recited in claim 1, wherein the particulate body includes elemental copper and the coating includes polydimethylsiloxane.

9. A method as recited in claim 1, wherein the particulate body is oxide-free, wherein an interface between the particulate body and the polymeric coating is metallic oxide-free.

10. A method of making particulate for an additive manufacturing technique, particles of the particulate having a copper particulate body with a surface and a polymeric coating disposed over the surface of the particulate body, the method comprising:
    receiving a copper metallic particulate at a fluidized bed apparatus;
    flowing a reducing gas through the metallic particulate;
    flowing a drying and degassing gas through the metallic particulate; and
    flowing a coating gas containing polydimethylsiloxane from vessel containing a polymeric material maintained at a polymeric material vaporization temperature through the metallic particulate,
    wherein the metallic particulate is maintained at a coating temperature that is less than the polymeric material vaporization temperature to encapsulate the metallic particulate with polymeric material coatings,
    wherein particulate bodies of the metallic particulate include only elemental copper,
    wherein polymeric coatings of the particulate bodies include polydimethylsiloxane, and
    wherein interfaces between the particulate bodies and the polymeric coating is metallic oxide-free.

11. A method as recited in claim 10, further comprising aggregating the coated particulate in a pile having an angle repose smaller than an angle of repose for elemental copper.

\* \* \* \* \*